United States Patent
Tao et al.

(10) Patent No.: US 11,543,345 B2
(45) Date of Patent: Jan. 3, 2023

(54) CHEMICAL COMPLEMENTARY METAL-OXIDE SEMICONDUCTOR (CCMOS) COLORIMETRIC SENSORS FOR MULTIPLEX DETECTION AND ANALYSIS

(71) Applicant: Arizona Board of Regents on behalf of Arizona State University, Scottsdale, AZ (US)

(72) Inventors: Nongjian Tao, Fountain Hills, AZ (US); Di Wang, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 220 days.

(21) Appl. No.: 16/857,660

(22) Filed: Apr. 24, 2020

(65) Prior Publication Data

US 2020/0340912 A1    Oct. 29, 2020

Related U.S. Application Data

(60) Provisional application No. 62/838,455, filed on Apr. 25, 2019.

(51) Int. Cl.
     *H01L 27/146*      (2006.01)
     *G01N 21/77*      (2006.01)
     (Continued)

(52) U.S. Cl.
     CPC .............. *G01N 21/251* (2013.01); *G01N 1/31* (2013.01); *G01N 21/77* (2013.01);
     (Continued)

(58) Field of Classification Search
     CPC .............. G01N 1/31; G01N 2001/317; G01N 2021/7753; G01N 2021/7756;
     (Continued)

(56) References Cited

U.S. PATENT DOCUMENTS 7,132,837 B1    11/2006   Tao
7,785,001 B2    8/2010    Tao et al.
(Continued)

FOREIGN PATENT DOCUMENTS

WO   WO2008021614 A2    2/2008
WO   WO2010036940 A2    4/2010
WO   WO-2015159280 A1 * 10/2015 ......... A61B 5/14517

OTHER PUBLICATIONS

Abbas et al., "Inkjet Printing of Ag Nanoparticles using Dimatix Inkjet Printer, No. 1," Protocols and Reports, Jan. 13, 2017: 1-10.
(Continued)

*Primary Examiner* — Mark R Gaworecki
(74) *Attorney, Agent, or Firm* — Fish & Richardson P.C.

(57) ABSTRACT

A colorimetric sensor array includes a CMOS image sensor having a surface including pixels and a multiplicity of colorimetric sensing elements. Each sensing element has a sensing material disposed directly on one or more of the pixels. The colorimetric sensing elements are distributed randomly on the surface of the CMOS image sensor. Fabricating the colorimetric sensor array includes spraying a sensing fluid in the form of droplets directly on a surface of a CMOS image sensor and removing the solvent from the droplets to yield a multiplicity of sensing elements on the surface of the CMOS image sensor. Each droplet covers one or more pixels of the CMOS image sensor with the sensing fluid. The sensing fluid includes a solvent and a sensing material. The droplets are distributed randomly on the surface of the CMOS image sensor.

20 Claims, 6 Drawing Sheets

(51) Int. Cl.
*G01N 21/25* (2006.01)
*G01N 1/31* (2006.01)

(52) U.S. Cl.
CPC .. *H01L 27/14645* (2013.01); *G01N 2001/317* (2013.01); *G01N 2021/7756* (2013.01)

(58) Field of Classification Search
CPC ......... G01N 2021/7793; G01N 21/251; G01N 21/77; G01N 21/78; H01L 27/14645
See application file for complete search history.

(56) References Cited

U.S. PATENT DOCUMENTS

| | | | |
|---|---|---|---|
| 7,830,561 | B2 | 11/2010 | Zomet et al. |
| 8,215,170 | B2 | 7/2012 | Tao et al. |
| 8,416,417 | B2 | 4/2013 | Foley et al. |
| 8,465,634 | B2 | 6/2013 | Tao et al. |
| 8,545,683 | B2 | 10/2013 | Tao et al. |
| 8,668,874 | B2 | 3/2014 | Tao et al. |
| 8,926,822 | B2 | 1/2015 | Tao et al. |
| 9,581,561 | B2 | 2/2017 | Tao et al. |
| 9,772,305 | B2 | 9/2017 | Tao |
| 9,909,993 | B2 | 3/2018 | Tao et al. |
| 10,078,795 | B2 | 9/2018 | Tao et al. |
| 10,209,232 | B2 | 2/2019 | Forzani et al. |
| 10,222,372 | B2 | 3/2019 | Tao et al. |
| 10,401,298 | B2 | 9/2019 | Tao et al. |
| 10,408,757 | B2 | 9/2019 | Tao et al. |
| 10,413,226 | B2 | 9/2019 | Tao et al. |
| 10,539,530 | B2 | 1/2020 | Tao |
| 10,663,442 | B2 | 5/2020 | Forzani et al. |
| 10,740,650 | B2 | 8/2020 | Tao et al. |
| 10,782,292 | B2 | 9/2020 | Tao et al. |
| 10,823,728 | B2 | 11/2020 | Tao et al. |
| 2007/0235348 | A1 | 10/2007 | Nagahara et al. |
| 2012/0270330 | A1 | 10/2012 | Tao et al. |
| 2013/0115137 | A1 | 5/2013 | Tao et al. |
| 2014/0276104 | A1 | 9/2014 | Tao et al. |
| 2018/0140255 | A1 | 5/2018 | Tao et al. |
| 2019/0082972 | A1 | 3/2019 | Tao et al. |
| 2019/0094146 | A1 | 3/2019 | Tao et al. |
| 2019/0239761 | A1 | 8/2019 | Tao et al. |
| 2020/0000370 | A1 | 1/2020 | Tao et al. |
| 2020/0022628 | A1 | 1/2020 | Tao et al. |
| 2020/0096472 | A1 | 3/2020 | Tao et al. |
| 2020/0156074 | A1 | 5/2020 | Tao et al. |
| 2020/0172951 | A1 | 6/2020 | Tao et al. |
| 2020/0372288 | A1 | 11/2020 | Tao et al. |
| 2021/0048206 | A1 | 2/2021 | Forzani et al. |
| 2021/0054432 | A1 | 2/2021 | Tao et al. |
| 2021/0065368 | A1 | 3/2021 | Tao et al. |
| 2021/0130868 | A1 | 5/2021 | Tao et al. |
| 2021/0172944 | A1 | 6/2021 | Tao |

OTHER PUBLICATIONS

Asif et al., "Flatcam: Thin, lensless cameras using coded aperture and computation," IEEE Transactions on Computational Imaging, Sep. 2017, 3(3):384-397.

Claramunt et al., "Flexible gas sensor array with an embedded heater based on metal decorated carbon nanofibres," Sensors and Actuators B: Chemical, Jan. 3, 2013, 187:401-406.

Dickson et al., "An integrated chemical sensor array using carbon black polymers and a standard CMOS process," Techical Digest Solid-State Sensor and Actuator Workshop, 2000:1-4.

Jensen et al., "Inkjet-printed gold nanoparticle electrochemical arrays on plastic. Application to immunodetection of a cancer biomarker protein," Physical Chemistry Chemical Physics, Jan. 7, 2011, 13:4888-4894.

Komuro et al., "Inkjet printed (bio) chemical sensing devices," Analytical and Bioanalytical Chemistry, May 16, 2013, 405:5785-5805.

Li et al., "Colorimetric Sensor Array for Monitoring CO and Ethylene," Analytical Chemistry, Dec. 14, 2018, 91:797-802.

Li et al., "The optoelectronic nose: colorimetric and fluorometric sensor arrays," Chemical Reviews, Sep. 12, 2018, 119:231-292.

Santos et al. "SAW sensor array for wine discrimination," Sensors and Actuators B: Chemical, Dec. 7, 2004, 107:291-295.

Su et al., "Miniaturized chemical multiplexed sensor array," Journal of the American Chemical Society, Jul. 24, 2003, 125:9930-9931.

Su et al., "Moving beyond molecules: patterning solid-state features via dip-pen nanolithography with sol-based inks," Journal of the American Chemical Society, Jan. 13, 2002, 124(8):1560-1561.

Zhao et al., "A pocket-sized metabolic analyzer for assessment of resting energy expenditure," Clinical Nutrition, 2014, 33:341-347.

\* cited by examiner

CHEMICAL COMPLEMENTARY METAL-OXIDE SEMICONDUCTOR (CCMOS) COLORIMETRIC SENSORS FOR MULTIPLEX DETECTION AND ANALYSIS

CROSS-REFERENCE TO RELATED APPLICATION

This application claims the benefit of U.S. Patent Application No. 62/838,455 entitled "CHEMICAL COMPLEMENTARY METAL-OXIDE SEMICONDUCTOR (CCMOS) COLORIMETRIC SENSORS FOR MULTIPLEX DETECTION AND ANALYSIS" and filed on Apr. 25, 2019, which is incorporated herein by reference in its entirety.

TECHNICAL FIELD

This invention relates to an integrated sensor chip including a complementary metal-oxide semiconductor (CMOS) image sensor.

BACKGROUND

Chemical or biological sensors based on detecting or imaging color changes, known as colorimetric sensors, have been used for various applications, including sensing toxic chemicals in air, biomarkers in breath, urine, and body fluids (e.g., blood). A typical colorimetric sensor includes a solid support, such as a glass slide, a silicon chip, or a piece of paper, on which a sensing material is deposited. The sensing material interacts or reacts with a target substance (e.g., toxic chemicals or biomarkers), changing the color of the sensing material. For multiplexed detection of different substances, multiple sensing materials are printed as an array on the support. To measure the color change of each element of the array, a light source is used to illuminate the sensing material on the support, an optical system is used to detect light transmitted or reflected from the sensing material, and an image of the array on is formed on an image sensor with an optical system. However, lens-based and lens-less optical systems introduce complexities that complicate the device as well as its operation.

SUMMARY

This disclosure relates to fabrication, calibration, and use of chemical sensor chips with a large array of multiplexed detection of different target analytes. An alignment-free and mask-free spraying method to create arrays of sensing elements of different sensing materials is described, in which droplets of a sensing fluid are sprayed directly onto a CMOS imager surface with a nozzle. The individual droplets fall onto the CMOS imager under gravity and form individual sensor elements. The droplets are randomly distributed on the surface of the CMOS imager. Positions of the resulting sensing elements are measured from the CMOS images, allowing tracking of each sensing element. By sequentially spraying droplets of different sensing materials, a random array having droplets of different materials is formed. Although the sensing (array) elements can be random in terms their positions (spatial distribution), the identity of the sensing material of each droplet can be assessed by comparing the images captured before and after spraying each sensing material. Applications include medical diagnosis, industrial and food safety, and air quality control.

In a first general aspect, a colorimetric sensor array includes a CMOS image sensor having a surface comprising pixels and a multiplicity of colorimetric sensing elements. Each sensing element has a sensing material disposed directly on one or more of the pixels. The colorimetric sensing elements of the multiplicity of colorimetric sensing elements are distributed randomly on the surface of the CMOS image sensor.

Implementations of the first general aspect may include one or more of the following features.

The colorimetric sensor array may include one or more additional multiplicities of colorimetric sensing elements. Each sensing element of each additional multiplicity of colorimetric sensing elements includes an additional sensing material disposed directly on one or more additional pixels. The colorimetric sensing elements of the additional multiplicity of colorimetric sensing elements are distributed randomly on the surface of the CMOS image sensor. The sensing material and the additional sensing material may be different. The colorimetric sensor array is configured to detect the presence of at least two or at least three different target analytes. The colorimetric sensor array can be configured to detect the presence of ozone, ammonia, acetone, nitrogen dioxide, or any combination thereof. One or more of the sensing elements may include porous nanoparticles.

In a second general aspect, fabricating a colorimetric sensor array includes spraying a sensing fluid in the form of droplets directly on a surface of a CMOS image sensor and removing the solvent from the droplets on the surface of the CMOS image sensor, thereby yielding a multiplicity of sensing elements on the surface of the CMOS image sensor. Each droplet covering one or more pixels of the CMOS image sensor with the sensing fluid. The sensing fluid includes a solvent and a sensing material. The droplets are distributed randomly on the surface of the CMOS image sensor.

Implementations of the second general aspect may include one or more of the following features.

The second general aspect may further include sequentially spraying one or more additional sensing fluids in the form of additional droplets directly on the surface of the CMOS image sensor. Each additional droplet covers one or more additional pixels of the CMOS image sensor with the one or more additional sensing fluids. Each of the one or more additional sensing fluids includes an additional solvent and an additional sensing material. The additional droplets are distributed randomly on the surface of the CMOS image sensor. The sensing material and the one or more additional sensing materials can be different. Spraying can include hydraulic spraying, ultrasonic spraying, electrostatic spraying, airbrushing, or flame spray pyrolysis.

In a third general aspect, a colorimetric sensor system includes a CMOS imager having sensing elements disposed directly and arranged randomly on a surface of the CMOS imager, a light source configured to illuminate the CMOS imager, a detector configured to detect a change in color of each sensing element, and a controller configured to identify a position of each sensing element on the surface of the CMOS imager and to assess a change in color of each droplet following contact of the sensing element with a target analyte.

Implementations of the third general aspect may include one or more of the following features.

The light source may include an ambient light source, a light emitting diode, a laser, or a display screen of an electronic device. The controller may be configured to compare an optical intensity of each of the sensing elements at a first time to the optical intensity of each of the sensing elements at a second time. In some cases, the controller is configured to assess a surface area of each sensing element. The colorimetric sensor system may include a pump or a fan configured to contact the sensing elements with a test fluid.

The details of one or more embodiments of the subject matter of this disclosure are set forth in the accompanying drawings and the description. Other features, aspects, and advantages of the subject matter will become apparent from the description, the drawings, and the claims.

DETAILED DESCRIPTION

Figure 1A:
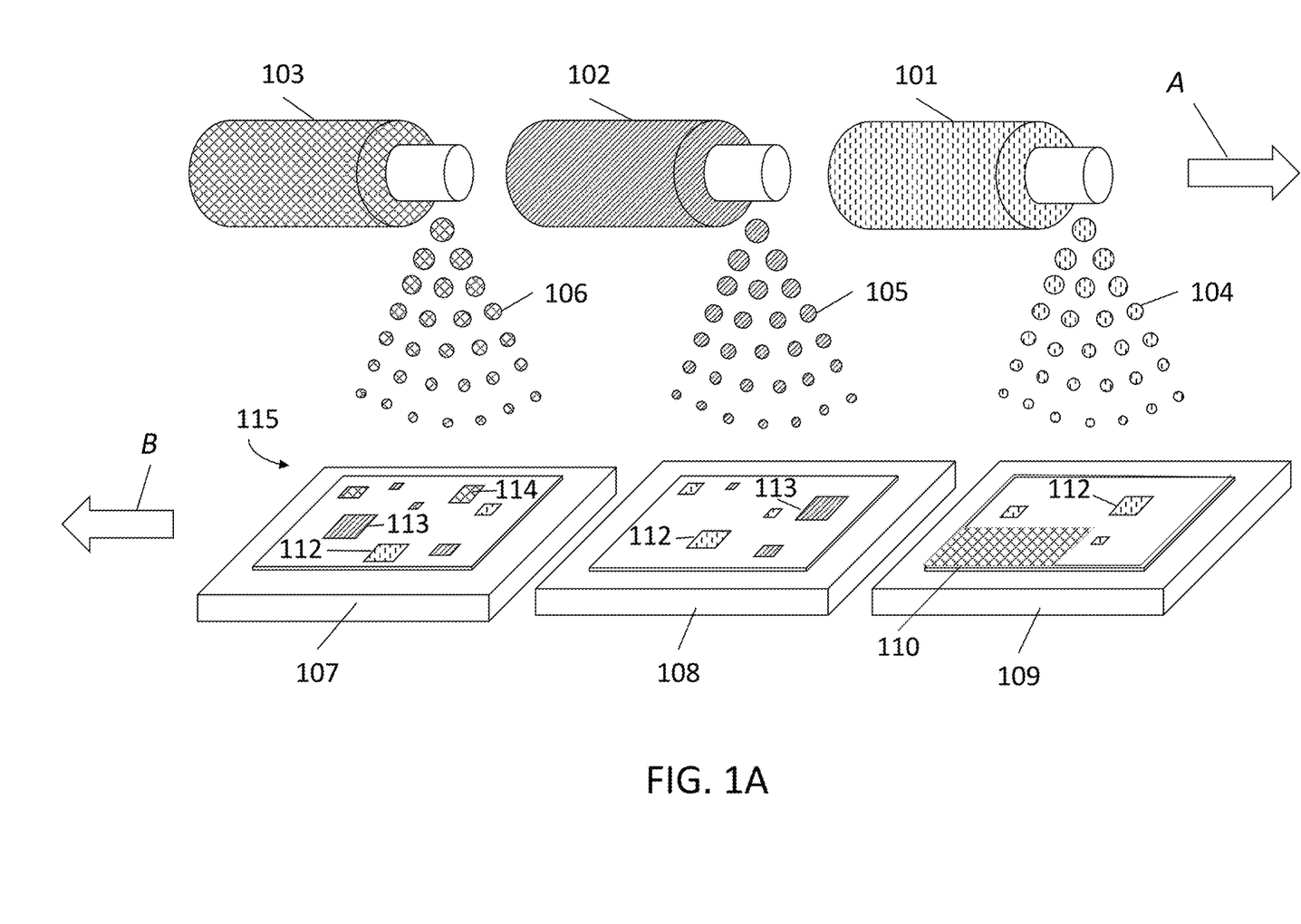
FIG. 1A depicts fabrication of a chemical complementary metal-oxide semiconductor (CCMOS) sensor array using sprayers.

FIG. 1A is a schematic depicting fabrication of a chemical complementary metal-oxide semiconductor (CCMOS) sensor array with sprayers. Each of sprayers 101, 102, 103 typically contains a fluid including a different sensing material, and dispenses droplets 104, 105, 106, respectively, toward CMOS image sensors (or imagers) 109, 108, 107, respectively, having pixels 110. For simplicity, pixels 110 are only shown on a portion of CMOS image sensor 109. Sprayers 101, 102, 103 can be translated in the direction of arrow A relative to CMOS imagers 107, 108, 109; CMOS imagers 107, 108, 109 can be translated in the direction of arrow B relative to sprayers 101, 102, 103 (e.g., on a conveyor); or both. When a CMOS imager is proximate a first sprayer, droplets of a first sensing fluid including a first sensing material are dispensed on the CMOS imager. The droplets may be provided in the form of a mist. Liquid in the droplets is removed (e.g., by evaporation) to yield a number of first sensing elements. When n sprayers are used, droplets of an $n^{th}$ sensing fluid including an $n^{th}$ sensing material are dispensed on the CMOS imager when the CMOS imager is proximate the $n^{th}$ sprayer to yield a number of $n^{th}$ sensing elements.

As depicted in FIG. 1A, droplets 104 of sensing fluid from sprayer 101 are dispensed on CMOS imager 109 to yield sensing elements 112; droplets 105 of sensing fluid from sprayer 102 are dispensed on CMOS imager 108 to yield sensing elements 113; and droplets 106 of sensing fluid from sprayer 103 are disposed on CMOS imager 107 to yield sensing elements 114. Relative translation of sprayers 101, 102, 103 and CMOS imagers 107, 108, 109 results in successive spraying of each CMOS imager with each sprayer, such that droplets of each sensing fluid are sprayed on each CMOS imager. Each of sensing elements 112, 113, 114 includes a sensing material disposed (e.g., disposed directly) on one or more of pixels 110 on CMOS imagers 107, 108, 109. As depicted in FIG. 1A, CCMOS sensor array 115 includes sensing elements 112, 113, 114 formed from droplets 104, 105, 106, respectively from sprayers 101, 102, 103, respectively. The position of each sensing element is measured from the CMOS images, allowing each sensing element to be tracked. The identity of the sensing material of each droplet is determined by comparing the images captured before and after each sensing material is dispensed on the imager.

Examples of suitable CMOS imagers include low cost CMOS imagers for end user products and high quality CMOS imagers for scientific applications. Each CMOS imager has dimensions on the order of 0.25 $mm^2$ to 600 $mm^2$ and typically includes a number of pixels in a range of 40 kilopixels to 122 megapixels. Droplets dispensed on each CMOS imager can be sized to cover one or more pixels on a CMOS imager, and typically have a volume in a range of $10^{-3}$ picoliters to 8 microliters. The resulting sensing elements can have a surface area in a range of 1 $\mu m^2$ to 4 $mm^2$. The number of sensing elements including a certain sensing material can be in a range of 1 to 1000.

Although FIG. 1A depicts three sprayers used to form CCMOS sensor arrays, any appropriate number of sprayers may be used (e.g., n can be one, two, three, or more than three). The number of sprayers may be selected based on the number of different sensing materials to be dispensed on the CCMOS sensor arrays. Various types of sprayers, such as hydraulic sprayers, ultrasonic sprayers, electrostatic sprayers, airbrushes, and flame spray pyrolysis sprayers can be used to fabricate CCMOS sensor arrays. The sprayers may be adjusted to dispense droplets of sensing fluid having a volume in a selected range. A total volume sprayed per unit time may be selected, together with a relative translation rate of the CMOS imagers and the sprayers, to achieve a selected coverage (e.g., a total volume in a selected range, a total number of droplets in a selected range, or both).

The sensing materials are selected based on the number and identity of the target analytes to be detected by the CCMOS sensor arrays. The sensing materials are typically colorimetric, and undergo a change in color when contacted by the target analyte. A sensing fluid including a sensing material typically has a concentration in a range of 1 $\mu M$ to 1 M. Suitable sensing materials include bromophenol blue for detecting ammonia, indigo carmine for detecting ozone, hydroxylamine sulfate and thymol blue for detecting acetone, N,N-dimethyl-1-naphthylamine for detecting nitrogen dioxide, and others. The fluid can be a solution including a solvent. Suitable solvents include water, alcohols (e.g., methanol, ethanol), and any other appropriate polar or nonpolar solvents, or any appropriate mixture thereof. In some cases, the fluid is a dispersion including particulate materials. Droplets dispensed on the CMOS imagers typically include an amount of sensing material in a range of 0.1 picograms to 10 milligrams. In some cases, the fluid includes one or more additives selected to improve the spraying process, adhesion to or spreading on the CMOS imager, performance of the sensing elements, or any combination thereof. Suitable additives include surfactants, porous nanoparticles, pigments, and humectants. In one example, porous nanoparticles (e.g., porous silica nanoparticles, porous silicon nanoparticles, and metal-organic framework nanoparticles) can be used as an additive to increase the sensitivity and lifetime of a sensing element due at least in part to the large surface area to volume ratio and large chemical load capacity of the nanoparticles. In another example, glycerol can increase the hydrophilicity of the sensing element, thereby accelerating certain chemical reactions.

Figure 1B:
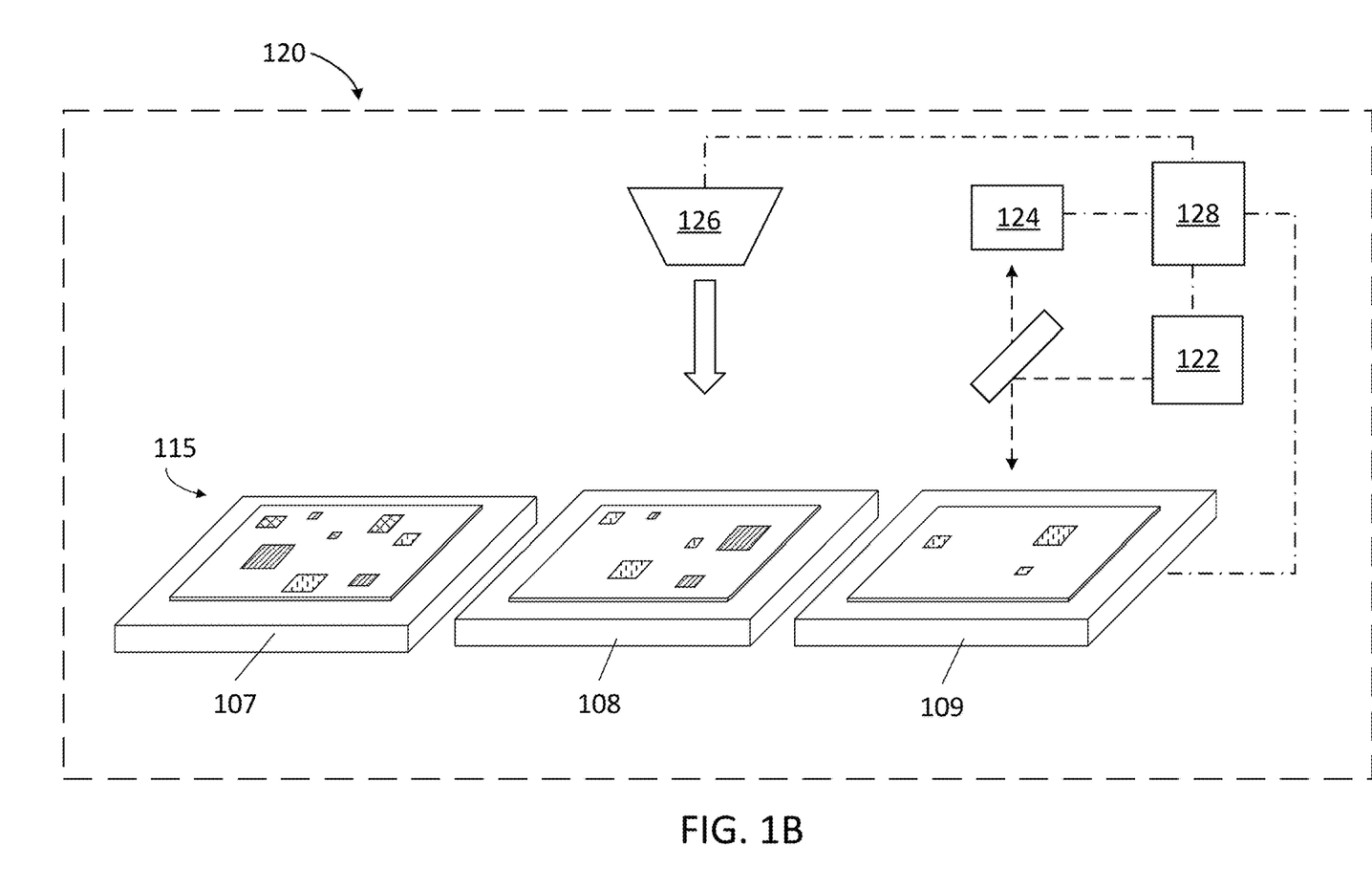
FIG. 1B depicts a colorimetric sensor system including the sensor array of FIG. 1A.

In some implementations, as depicted in FIG. 1B, colorimetric sensor system 120 includes a CMOS imager (e.g., CMOS imager 107, 108, 109) or sensor array (e.g., sensor array 115), light source 122 configured to illuminate the CMOS imager, detector 124 configured to detect a change in color of each sensing element, and fan or pump 126 configured to contact sensing elements in sensor array 115 with a fluid to be tested. The light source may include an ambient light source, a light emitting diode, a laser, or a display screen of an electronic device. Colorimetric sensor system 120 may also include controller 128 configured to identify a position of each sensing element on the surface of the CMOS imager and to assess a change in color of each droplet following contact of the sensing element with a target analyte. The controller is typically configured to compare an optical intensity of each of the sensing elements at a first time to the optical intensity of each of the sensing elements at a second time. In some cases, the controller is configured to assess a surface area of each sensing element.

EXAMPLES

Example 1. CCMOS Sensor for Ammonia Detection

Figure 2:
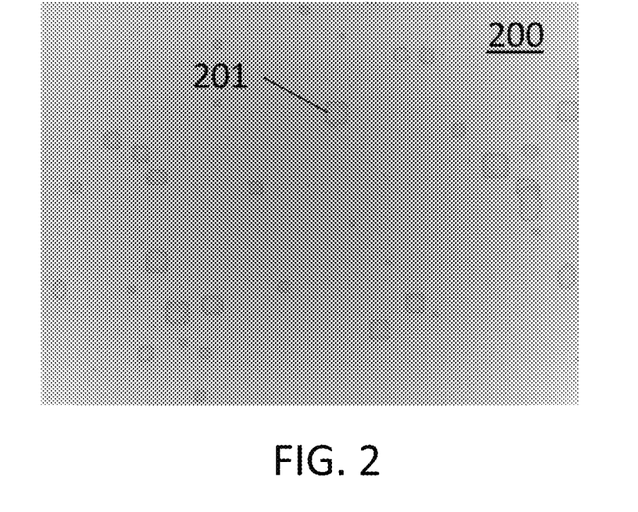
FIG. 2 shows an image of a CCMOS sensor with sprayed ammonia sensing droplets.

A CCMOS colorimetric ammonia sensor array was manufactured using a sprayer. Ammonia sensing solution was prepared by dissolving 15 mg bromophenol blue in 10 mL ethanol. The sensing solution was filled in a plastic mist sprayer and sprayed directly on the surface of a lensless CMOS imager. FIG. 2 is an image of a portion of CCMOS ammonia sensor 200 including ammonia sensing elements 201. The orange ammonia sensing elements turned purple after exposure to ammonia.

Example 2. CCMOS Sensor Array for Detection of Ozone, Ammonia, and Acetone

Figure 3:
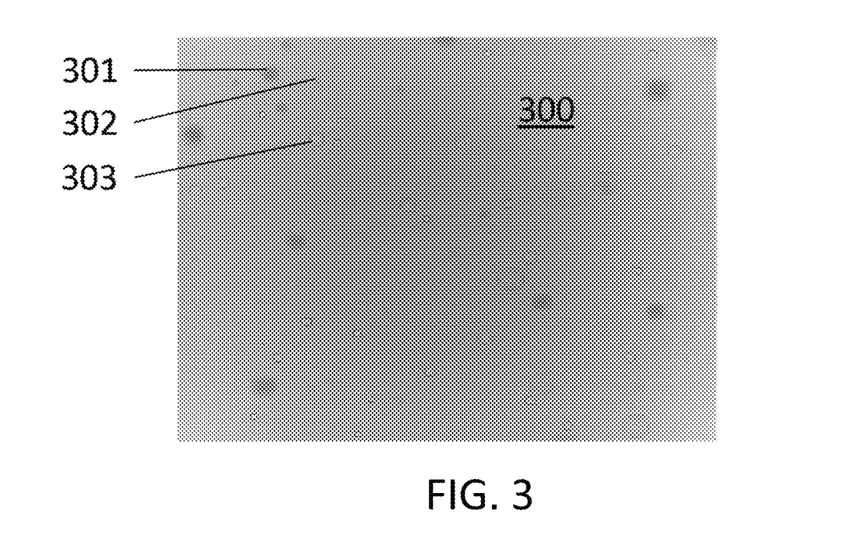
FIG. 3 shows an image of a CCMOS sensor array with sprayed ammonia, acetone, and ozone sensing droplets.
Figure 4:
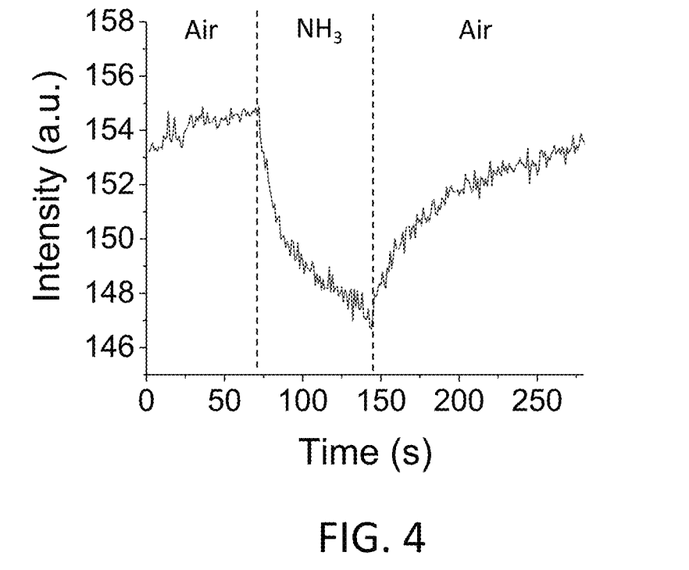
FIG. 4 shows an example response of a reversible ammonia sensing droplet.
Figure 5:
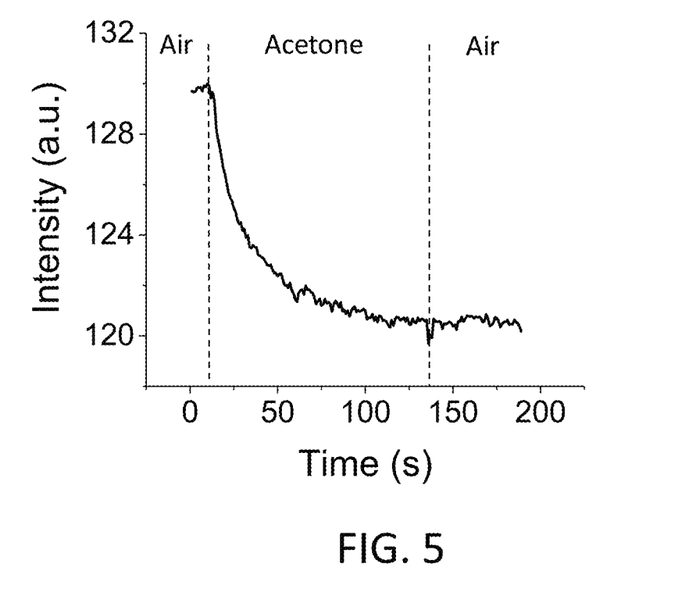
FIG. 5 shows an example response of an irreversible acetone sensing droplet.

A CCMOS colorimetric sensor array for detection of ozone, ammonia, and acetone was fabricated using sprayers. Ozone sensing solution was prepared by dissolving 9 mg indigo carmine in 1.2 mL water and 3.4 mL ethanol. Ammonia sensing solution was prepared by dissolving 15 mg bromophenol blue in 10 mL ethanol. Acetone sensing solution was prepared by dissolving 100 mg hydroxylamine sulfate and 2 mg thymol blue in 3 mL water and 7 mL methanol. The three sensing solutions were filled in three plastic mist sprayers and sprayed sequentially on lensless CMOS imager 300. Ozone sensing element 301 turns colorless after exposure to ozone. Ammonia sensing element 302 turns purple after exposure to ammonia. Acetone sensing element 303 turns pink after exposure to acetone. The intensity and absorbance change of the sensing elements can be used to determine color change. Colorimetric sensing recipes can be reversible or irreversible depending on the specific chemical reaction. The ammonia sensing reaction used in this example is reversible. FIG. 4 shows a typical response of the ammonia sensing element to ammonia. The ozone and acetone recipes used in this example are irreversible. FIG. 5 shows a typical response of the acetone sensing element to acetone.

Example 3. CCMOS Nitrogen Dioxide ($NO_2$) Sensor with Improved Sensitivity and Lifetime by Incorporating Silica Nanoparticles ($SiO_2$ NP)

Figure 6A:
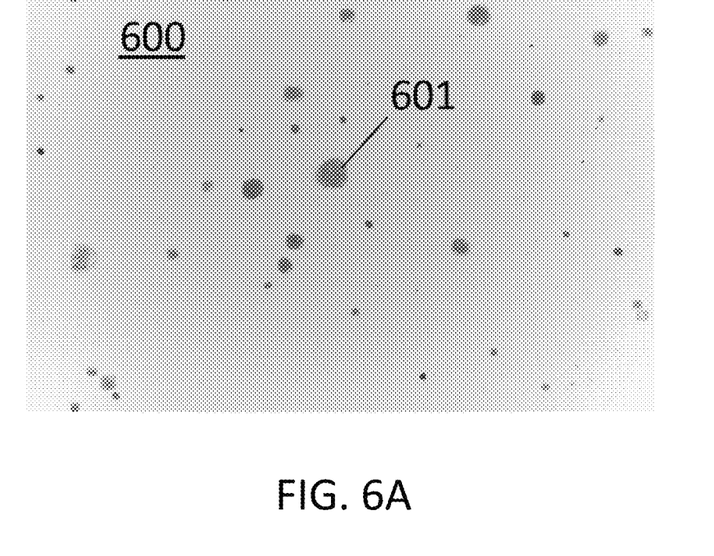
FIG. 6A shows an image of a CCMOS nitrogen dioxide sensor with silica nanoparticles.
Figure 6B:
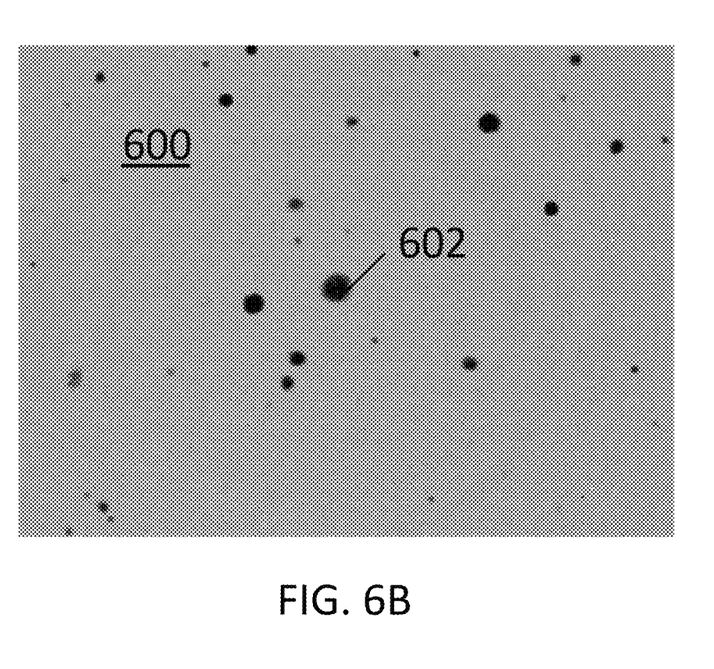
FIG. 6B is a differential image showing the color change of the CCMOS nitrogen dioxide sensor of FIG. 6A before and after exposure to nitrogen dioxide.

$NO_2$ colorimetric sensing solution was prepared by mixing 200 μL N, N-dimethyl-1-naphthylamine with 40 mL ethanol. Various amounts of $SiO_2$ NP (5-15 nm) were added to the sensing solutions to demonstrate how nanoparticles improve the performance of the sensing elements. The $SiO_2$ NP concentrations in the five sensing solutions were 0 mg/mL, 17 mg/mL, 33 mg/mL, 50 mg/mL, and 67 mg/mL, respectively. FIG. 6A is an image of a portion of lensless CMOS imager 600 with sensing elements 601 formed from all five sensing solutions. To compare the sensitivity and lifetime of sensing elements having different $SiO_2$ NP concentrations, 100 ppb and 25 ppm $NO_2$ were tested continuously on the same CMOS imager. FIG. 6B is an image of a portion of lensless CMOS imager 600 with sensing elements 602. The color change before and after test is shown as a differential image.

Figure 6C:
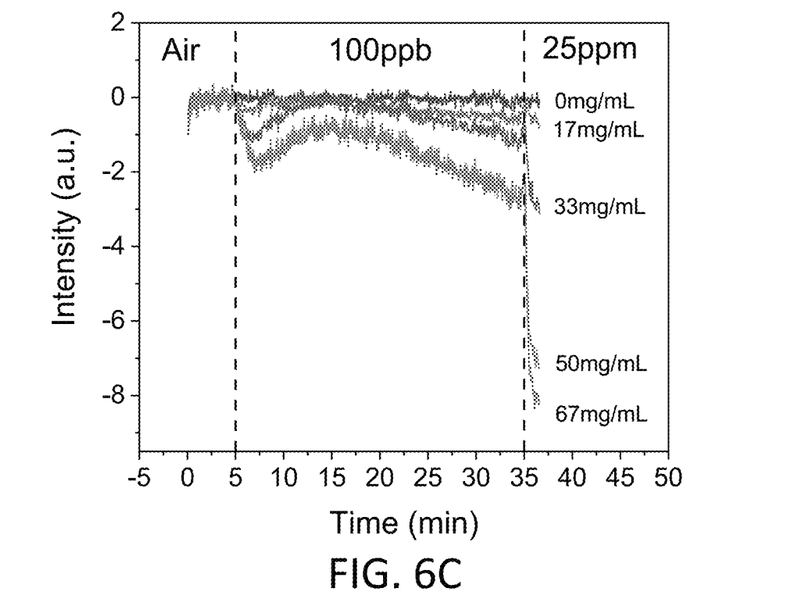
FIGS. 6C and 6D show intensity of droplets over time for various concentrations of silica nanoparticles and droplet size, respectively, for the CCMOS nitrogen dioxide sensor of FIG. 6A.
Figure 6D:
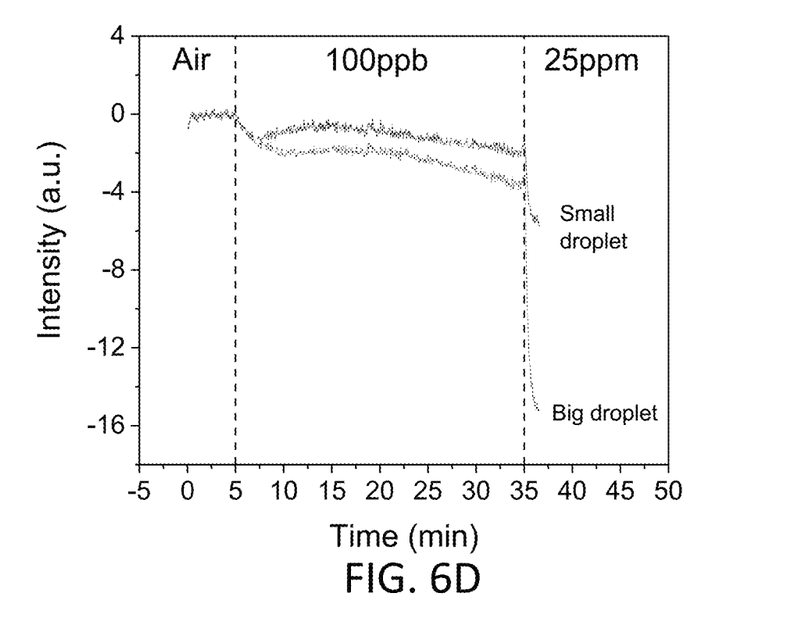

FIG. 6C shows the intensity of the five sensing elements with similar size and different $SiO_2$ NP concentrations described with respect to FIG. 6A. The dips after switching to 100 ppb $NO_2$ from air are due at least in part to the humidity difference between the ambient air and 100 ppb $NO_2$ sample. It takes a longer time for the droplets with higher $SiO_2$ NP concentrations to be humidity balanced because of the hydrophilic property of the $SiO_2$ NP. After the humidity was balanced, droplets with higher $SiO_2$ NP concentrations showed higher sensitivity to 100 ppb $NO_2$. This is believed to be due to the large surface area to volume ratio of the $SiO_2$ NP. However, the sensitivity appears to stop increasing when the $SiO_2$ NP concentration exceeds 50 mg/mL. This is believed to be because there is sufficient surface area for all the chemicals to be thinly coated. As such, additional $SiO_2$ NPs don't increase the probability of interaction between the chemicals with the target analytes. FIG. 6D shows a comparison of two sensing elements with the same $SiO_2$ NP concentration and different droplet size. They showed similar sensitivity to 100 ppb $NO_2$, but the response of the smaller sensing element to 25 ppm $NO_2$ is much lower than that of the larger sensing element, thus indicating smaller dynamic range and shorter lifetime. The similar sensitivity at low concentration $NO_2$ can be attributed to same $SiO_2$ NP concentration. The chemicals are adequate for both small and large sensing elements, since a similar amount of sensing material per unit area can react with $NO_2$ within a given amount of time, thereby producing similar color changes. For high concentration $NO_2$, larger sensing elements are generally thicker, such that more sensing material can react with the target analytes per unit area, thus more light intensity change, or color change can be observed on the CMOS imager.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A colorimetric sensor array comprising:
   a CMOS image sensor having a surface comprising pixels; and
   a first multiplicity of colorimetric sensing elements, each sensing element comprising a first sensing material disposed directly on one or more of the pixels, wherein the colorimetric sensing elements of the first multiplicity of colorimetric sensing elements are distributed randomly on the surface of the CMOS image sensor; and
   a second multiplicity of colorimetric sensing elements, each sensing element of the second multiplicity of colorimetric sensing elements comprising a second sensing material disposed directly on one or more of the pixels, wherein the first sensing material and the second sensing material are different, and the colorimetric sensing elements of the first multiplicity of colorimetric sensing elements and the second multiplicity of colorimetric sensing elements are randomly arranged among each other on the surface of the CMOS image sensor.

2. The colorimetric sensor array of claim 1, further comprising a third multiplicity of colorimetric sensing elements, each sensing element of the third multiplicity of colorimetric sensing elements comprising a third sensing material disposed directly on one or more of the pixels, wherein the colorimetric sensing elements of the third multiplicity of colorimetric sensing elements are distributed randomly on the surface of the CMOS image sensor.

3. The colorimetric sensor array of claim 2, wherein the colorimetric sensor array is configured to detect the presence of at least three different target analytes.

4. The colorimetric sensor array of claim 1, wherein the colorimetric sensor array is configured to detect the presence of at least two different target analytes.

5. The colorimetric sensor array of claim 1, wherein the colorimetric sensor array is configured to detect the presence of ozone, ammonia, acetone, nitrogen dioxide, or a combination thereof.

6. The colorimetric sensor array of claim 1, wherein each sensing element further comprises porous nanoparticles.

7. A colorimetric sensor system comprising:
   the colorimeteric sensor array of claim 1;
   a light source configured to illuminate the colorimeteric sensor array;
   a detector configured to detect a change in color of each sensing element; and
   a controller configured to identify a position of each sensing element on the surface of the colorimeteric sensor array and to assess a change in color of each sensing element following contact of the sensing element with a target analyte.

8. The colorimetric sensor system of claim 7, wherein the light source comprises an ambient light source, a light emitting diode, a laser, or a display screen of an electronic device.

9. The colorimetric sensor system of claim 7, further comprising a pump or a fan configured to contact the sensing elements with a test fluid.

10. The colorimetric sensor system of claim 7, wherein the controller is configured to compare an optical intensity of each of the sensing elements at a first time to the optical intensity of each of the sensing elements at a second time.

11. The colorimetric sensor system of claim 7, wherein the controller is configured to assess a surface area of each sensing element.

12. A method of fabricating a colorimetric sensor array, the method comprising:
    spraying a sensing fluid in the form of droplets directly on a surface of a CMOS image sensor, each droplet covering one or more pixels of the CMOS image sensor with the sensing fluid, wherein the sensing fluid comprises a solvent and a sensing material and the droplets are distributed randomly on the surface of the CMOS image sensor; and
    removing the solvent from the droplets on the surface of the CMOS image sensor, thereby yielding a multiplicity of sensing elements on the surface of the CMOS image sensor.

13. The method of claim 12, further comprising sequentially spraying one or more additional sensing fluids in the form of additional droplets directly on the surface of the CMOS image sensor, each additional droplet covering one or more additional pixels of the CMOS image sensor with the one or more additional sensing fluids, wherein each of the one or more additional sensing fluids comprises an additional solvent and an additional sensing material and the additional droplets are distributed randomly on the surface of the CMOS image sensor.

14. The method of claim 12, wherein the sensing material and the one or more additional sensing materials are different.

15. The method of claim 12, wherein spraying comprises hydraulic spraying, ultrasonic spraying, electrostatic spraying, airbrushing, or flame spray pyrolysis.

16. A colorimetric sensor array comprising:
    a CMOS image sensor having a surface comprising pixels; and
    a multiplicity of colorimetric sensing elements, each sensing element comprising a sensing material disposed directly on one or more of the pixels, wherein the colorimetric sensing elements of the multiplicity of colorimetric sensing elements are distributed randomly on the surface of the CMOS image sensor, and wherein each sensing element further comprises porous nanoparticles.

17. The colorimetric sensor array of claim 16, further comprising one or more additional multiplicities of colorimetric sensing elements, each sensing element of each additional multiplicity of colorimetric sensing elements comprising an additional sensing material disposed directly on one or more additional pixels, wherein the colorimetric sensing elements of the additional multiplicity of colorimetric sensing elements comprise porous nanoparticles and are distributed randomly on the surface of the CMOS image sensor.

18. The colorimetric sensor array of claim 17, wherein the sensing material and the additional sensing material are different.

19. The colorimetric sensor array of claim 18, wherein the colorimetric sensor array is configured to detect the presence of at least two different target analytes.

20. The colorimetric sensor array of claim 19, wherein the colorimetric sensor array configured is to detect the presence of ozone, ammonia, acetone, nitrogen dioxide, or any combination thereof.

* * * * *